United States Patent [19]

Dupraz

[11] 4,437,134
[45] Mar. 13, 1984

[54] DISCHARGE CIRCUIT FOR RAPIDLY ELIMINATING CHARGE TRAPPED IN A CAPACITOR VOLTAGE DIVIDER USED FOR MONITORING HIGH VOLTAGE AC

[75] Inventor: Jean-Pierre Dupraz, Aix-Les-Bains, France

[73] Assignee: Societe Anonyme dite: Alsthom-Atlantique, Paris, France

[21] Appl. No.: 318,535

[22] Filed: Nov. 5, 1981

[30] Foreign Application Priority Data

Nov. 6, 1980 [FR] France .................................. 80 23700

[51] Int. Cl.³ .............................................. H02H 7/16
[52] U.S. Cl. ...................................... 361/56; 324/111; 324/126
[58] Field of Search .................. 361/56; 324/111, 126, 324/133

[56] References Cited

U.S. PATENT DOCUMENTS

4,196,388  4/1980  Weller et al. ..................... 324/126 X
4,327,390  4/1982  Despiney ......................... 324/126 X

FOREIGN PATENT DOCUMENTS

2634595  3/1977  Fed. Rep. of Germany .
2406828  5/1979  France .

Primary Examiner—Reinhard J. Eisenzopf
Attorney, Agent, or Firm—Sughrue, Mion, Zinn, Macpeak & Seas

[57] ABSTRACT

The voltage divider comprises a capacitor column (11) for dropping nearly all of the high voltage and a base capacitance (10) connected in series therewith so that a small voltage appears there across. Said discharge circuit comprises a diode rectifier bridge (15, 16, 17, 18) connected by its AC terminals in parallel with the base capacitance, and two identical windings (20, 21, 22, 23) connected in parallel respectively with two of the diodes (15, 16) of the bridge, both of said winding-shunted diodes being connected to the same one of the AC terminals of the diode bridge.

4 Claims, 2 Drawing Figures

DISCHARGE CIRCUIT FOR RAPIDLY ELIMINATING CHARGE TRAPPED IN A CAPACITOR VOLTAGE DIVIDER USED FOR MONITORING HIGH VOLTAGE AC

The present invention relates monitoring high voltage AC, particularly as used in high tension power transmission grids.

BACKGROUND OF THE INVENTION

Monitoring high voltage AC, such as that found in electricity power transmission grids, is done by means of a measurement signal derived from a voltage divider which, for reasons of cost, is generally a capacitive divider constituted by a capacitive column that drops nearly all of the high voltage connected in series with a base capacitance that can only withstand a low voltage and which delivers the measurement signal. The measurement signal is a faithful image of the waveform of the high voltage AC provided that it is fed into an instrument having an input impedance that is several tens of times greater than the impedance of the base capacitance, and except for certain special circumstances when charge is trapped in the base capacitance and causes the measurement waveform voltage in change abruptly. Charge becomes trapped due to the difference between the discharge time of the capacitive column and that of the base capacitance. When there is an interruption in the high voltage AC, the same amount of charge remains trapped in the capacitive column as in the base capacitance, but the discharge rates of the two halves of the capactive voltage divider are very different and the amount of charge remaining in each half rapidly becomes very different. Unless the AC is re-established very quickly, or after a long enough period for both halves to have discharged fully, there will be more charge on the base capacitance than on the capacitive column, thereby wrongly dividing the AC at the moment it is re-established. This is because the base capacitance discharges slowly through a high impedance, giving a slowly decaying DC measurement signal with a discharge time constant of several tens of seconds.

Unless special precautions are taken, this error voltage saturates the monitoring equipment which receives the measurement signal and makes it inoperative. One known way of protecting the monitoring equipment is to insert a selective filter centered on the frequency of the high voltage AC in between the monitoring equipment and the capacitive divider. This is done each time there is a danger of trapped charge appearing, i.e. for an appreciable period of time on some occasions that the high voltage is re-established. Unfortunately, such a filter also modifies the measurment signal and considerably reduces the accuracy of measurements made for the hundred or so seconds it is inserted.

Preferred embodiments of the present invention reduce the drawbacks due to trapped charge by eliminating it very quickly without causing too much disburbance to the measurement signal.

SUMMARY OF THE INVENTION

The present invention provides a discharge circuit for rapidly eliminating charge trapped in a capacitor voltage divider used for monitoring high voltage AC, said voltage divider comprising a capacitor column for dropping nearly all of the high voltage and a base capacitance connected in series therewith so that a small voltage appears there across, wherein said discharge circuit comprises a diode rectifier bridge connected by its AC terminals in parallel with the base capacitance, and two identical windings connected in parallel respectively with two of the diodes of the bridge, both of said winding-shunted diodes being connected to the same one of the AC terminals of the diode bridge.

Advantageously, the circuit further comprises: a controlled switch connected in series between the diode bridge and the terminals of the base capacitance; an AC detector circuit connected across the terminals of the base capacitance; and a timing circuit responsive to the AC detector circuit to close the controlled switch a few seconds after the AC detector circuit detects that the AC has been interrupted, and to open the controlled switch a few tens of milliseconds after the AC detector circuit detects AC has been re-established.

BRIEF DESCRIPTION OF THE DRAWING

Embodiments of the invention are described by way of example with reference to the accompanying drawing, in which.

MORE DETAILED DESCRIPTION

Figure 1:
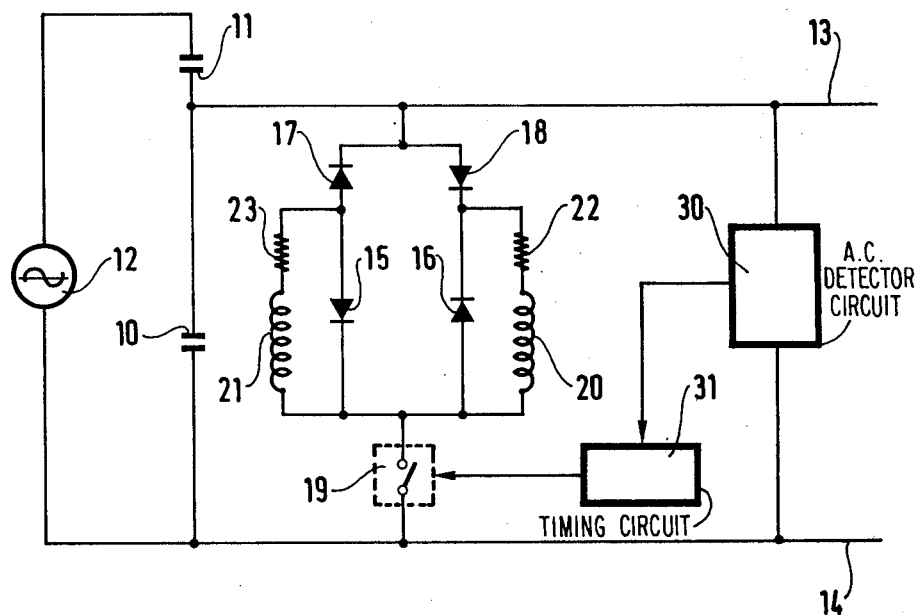
FIG. 1 is a circuit diagram of a first embodiment.

In FIG. 1, a capacitive voltage divider is represented by two capacitors 10 and 11 connected in series. The capacitor 10 represents the base capacitance, while the capacitor 11 represents the capacitive column. The ends of the voltage divider are connected to the terminals of a source of electricity 12 which delivers the high voltage AC to be monitored. The terminals 13 and 14 of the base capacitance 10 provide a measurement signal which is supposed to reproduce the waveform of the high voltage AC to be monitored, but at low voltage. A discharge circuit in accordance with the present invention is connected across the terminals 13 and 14 of the base capacitance 10. The discharge circuit comprises a controlled switch 19 connected in series with the AC terminals of a recifier bridge having four diodes 15, 16, 17 and 18. Two identical windings are connected in parallel with respective diodes of one of the pairs of diodes connected to the same one of the AC terminals of the diode bridge. In the example shown the diodes in question are the diodes 15 and 16, and the windings are represented by ideal inductances 20, 21 connected in series with respective ideal resistances 22, 23. The controlled switch is controlled by a timing circuit 31 responsive to an AC detector circuit 30 which is connected acros the terminals 13 and 14 of the base capacitance 10.

The controlled switch 19 is optional, and could be replaced by a short circuit. Its function is to connect the discharge circuit only when charge is likely to be trapped in the voltage divider, and to disconnect it once the charge has been eliminated.

As mentioned above, trapped charge is only a problem when the high voltage AC is re-established after being down for a threshold period of a few seconds. It is thus sufficient for the controlled switch 19 to be closed only after said threshold period has been exceeded, and to open the switch again a short period after AC is re-established, said short period being about one hundred milliseconds, and long enough for the discharge circuit to eliminate any trapped charge. The AC detector 30 is a conventional circuit providing a binary output signal whose level corresponds to the presence or absence of AC across the terminals 13, 14 at an amplitude greater than some given threshold. The timing circuit 31 provides two different time delays: a first delay which prevents the switch 19 from being closed until several seconds, say five, have elapsed after a break in the high voltage AC; and a second delay which prevents the switch 19 from being opened again until about one hundred milliseconds after the return of high voltage AC has been detected. The circuits that provide these time delays are not described in detail since such is common technical practice. The controlled switch 19 is preferably a simple conventional electromechanical relay because of its low resistance when closed and its effective isolation when open. There is no need for the high switching speed that a semi-conductor device could supply, for example.

Apart from the conduction direction of the diodes, the circuit comprises two similar branches connected in parallel across the terminals 13, 14 of the base capacitance 10 by the controlled switch 19. One of the branches is constituted by the components 16, 18, 20 and 22 and passes trapped charge that would tend to make the terminal 13 of the base capacitance 10 positive relative to the terminal 14, while the other branch comprises the components 15, 17, 21 and 23 and passes trapped charge that would tend to make the terminal 13 of the base capacitance 10 negative relative to the terminal 14.

Trapped charge that would tend to make the terminal 13 of the base capacitance 10 positive relative to the terminal 14 passes through the inductance 20, the resistance 22 and the diode 18. The diode 16 loops the inductance 20 so that it can dissipate energy in the resistance 22 without transferring any to the base capacitor 10. It also prevents the potential at the cathode of the diode 18 from dropping below that of the terminal 14 thereby preventing the diode 18 from conducting when the terminal 13 of the base capacitance 10 goes negative relative to the terminal 14.

Similarly, trapped charge that would tend to make the terminal 13 of the base capacitance 10 negative relative to the terminal 14 passes through the diode 17, the resistance 23 and the inductance 21. The diode 15 loops the inductance 21 so that it can dissipate energy in the resistance 23 without transferring any to the base capacitor 10. It also prevents the potential at the anode of the diode 17 from rising above that of the terminal 14 thereby preventing the diode 17 from conducting when the terminal 13 of the base capacitance 10 goes positive relative to the terminal 14.

The rate of charge flow through the circuit depends on its transient behavior. Ignoring the forward voltage drop of the diodes, the transient behavior is that determined by the inductance L of the ideal inductors 20 and 21, and the resistance R of the ideal resistances 22 and 23 connected across the terminals of a charged capacitor, except that the discharge current is prevented from reversing after it has fallen to zero. To reduce the time taken for the trapped charge to escape, the first current zero should be made to occur as soon as possible, i.e. an oscillating discharge should be aimed for. This occurs when the well known relationship:

$$R^2 < 4L/C \quad (1)$$

is satisfied, where C is the base capacitance. The duration of the discharge flow is then:

$$\frac{1}{\sqrt{\frac{1}{LC} - \frac{R^2}{4L^2}}} \left( \frac{\pi}{2} + \tan^{-1} \frac{1}{\sqrt{\frac{4L}{CR^2} - 1}} \right)$$

The effect of the circuit on the measurement signal depends on the current drawn from the capacitance 10 by the circuit if it remains connected by the switch 19 under normal operating conditions. To evaluate this effect, the current passing through the inductances 20 and 21 can be calculated for the case where the circuit has AC applied thereto. The inductance 20 can be used for a worked example, supposing that the terminal 13 of the base capacitance 10 is maintained at an alternating voltage V sin wt relative to the terminal 14.

During each first half-period (O to $\pi/w$) of each cycle, the circuit branch constituted by the components 16, 18, 20 and 22 will be in forced excitation with the diode 18 biased ON and the diode 16 biased OFF. During the remainder of the time, i.e. during each second half-period ($\pi/w$, $2\pi/w$) of each cylce it will be freely damped with the diode 18 OFF and the diode 16 ON.

The current i(t) passing through the inductance 20 during the first half-periods of forced excitation for the said branch 16, 18, 20 and 22 is given by the differential equation:

$$Ri + L\frac{di}{dt} = V \sin wt$$

whose general solution is:

$$i(t) = i_{10}e^{(-\frac{R}{L}t)} + i_p \sin \phi e^{(-\frac{R}{L}t)} + i_p \sin(wt + \phi)$$

where $$i_p = \frac{V}{\sqrt{R^2 + L^2 w^2}} \text{ and } \phi = \tan^{-1} \frac{Lw}{R}$$

and $i_{10}$ is the value of the current at instants $t = 0 + 2K\pi$

The current i(t) passing through the inductance 20 during the second half-periods when the branch 16, 18, 20 and 22 is freely damped is given by the differential equation:

$$Ri + L\frac{di}{dt} = 0$$

whose general solution is:

$$i(t) = i_{11}e^{(-\frac{Rt}{L})}$$

where $i_{11}$ is the current at $t = \pi/w + 2K\pi$

In normal operation the current through the inductance 20 at the end of each first half-period is the same as that at the beginning of each second half-period, whence:

$$i_{10} = i_{11}e^{(-\frac{R\pi}{Lw})}$$

and consequently the current during forced excitation (i.e. the first half-periods) can be completely determined as follows:

$$i(t) = \frac{V}{\sqrt{R^2 + L^2w^2}} \left( \sin(wt - \phi) + \sin\phi \frac{e^{(-\frac{R}{L}t)}}{1 - e^{(-\frac{R\pi}{Lw})}} \right)$$

This is the current draw from the source V sin wt by the discharge circuit during the first half-periods while the diode 17 in the other branch is OFF.

The current drawn from the source V sin wt by the discharge circuit during the second half-period is due to the other branch, and can be deduced from that calculated for the first branch by taking account of the direction current flow and the $\pi/w$ phase shift.

$$i(t) = -\frac{V}{\sqrt{R^2 + L^2w^2}} \left( \sin(wt - \phi - \pi) + \sin\phi \frac{e^{(-\frac{R}{L}t + \frac{R\pi}{Lw})}}{1 - e^{(-\frac{R\pi}{Lw})}} \right)$$

The total current drawn by the discharge circuit is the sum of these two currents and may be expressed:

$$i(t) = \frac{V}{\sqrt{R^2 + L^2w^2}} \left( \sin(wt - \phi) + (-1)^n \sin\phi \frac{e^{(-\frac{R}{L}t_1)}}{1 - e^{(-\frac{R\pi}{Lw})}} \right)$$

where $t = t_1$ modulo $\pi/w$ and $n = (t - t_1) \times w/\pi$

This current may be decomposed into two parts, a first part:

$$i_A(t) = \frac{V}{\sqrt{R^2 + L^2w^2}} \sin(wt - \phi)$$

which is the current drawn from the source by an inductance L in series with a resistance R; and a second part:

$$i_B(t) = \frac{V}{\sqrt{R^2 + L^2w^2}} \sin\phi \frac{e^{(-\frac{R}{L}t_1)}}{1 - e^{(-\frac{R\pi}{Lw})}}$$

which is a pulsating current.

It will be observed that the current component $i_B$ can be considered to be a correcting component present during the first half of the positive half-periods of the source V sin wt, tending to counteract the phase shift effect of the current component $i_A$, provided that $i_B$ is approximately:

$$\frac{V}{\sqrt{R^2 + L^2w^2}} \sin\phi$$

at the beginning of the positive half-periods of the source V sin wt, i.e. where:

$$\left| \frac{V}{\sqrt{R^2 + L^2w^2}} \sin\phi \left( \frac{1}{1 - e^{(-\frac{R\pi}{Lw})}} - 1 \right) \right| < \epsilon I_p$$

and provided it becomes a negligeable quantity after one half-period.

$$\left| \frac{V}{\sqrt{R^2 + L^2w^2}} \sin\phi \frac{e^{(-\frac{R\pi}{Lw})}}{1 - e^{(-\frac{R\pi}{Lw})}} \right| < \epsilon I_p$$

Under these conditions, the current $i_A$ can be ignored when investigating the effect of the discharge circuit on the measurement signal during normal operation.

The second condition is included in the first which can be expressed by replacing sin $\phi$ by its value:

$$\frac{1}{\left(\frac{R^2}{L^2w^2} + 1\right)^{\frac{1}{2}}} \cdot \frac{1}{e^{(+\frac{R\pi}{Lw})} - 1} < \epsilon \quad (2)$$

This condition is easy to satisfy in practice. To do this, it is sufficient to put $R/Lw > 0.2$. The condition then becomes:

$1.12 < \epsilon$

For $R/Lw = 1$ the condition becomes:

$0.03 < \epsilon$ and for $R/Lw = 5$ the condition becomes:

$2.9 \times 10^{-8} < \epsilon$

Assuming that equation (2) is satisfied, the effect of the discharge circuit on the measurement signal during normal operation is less than the effect of connecting an inductance L in series with a resistance R directly across the terminals of the base capacitance 10.

The value of the base capacitance 10 is much larger than that of the column 11 (to divide the voltage). Putting the value of the base capacitance 10 as C, the relative amplitude of connecting said LR circuit across the capacitance C would be:

$$\left| \frac{v'}{v} - 1 \right| = \left| \frac{1}{LCw^2 - 1 - jRCw} \right| = \frac{1}{\sqrt{(LCw^2 - 1)^2 + R^2C^2w^2}}$$

where v is the voltage across the terminals of the base capacitance without the LR circuit and v' the same voltage with the LR circuit present.

Assuming that the condition:

$LCw^2 \gg 1$ \quad (3)

is satisfied, then the relative error is little different from:

$$\left| \frac{v'}{v} - 1 \right| \approx \frac{1}{Cw} \frac{1}{\sqrt{R^2 + L^2w^2}}$$

It is small because of the condition (3).

The relative phase error on the measurement signal due to an LR circuit would be:

$$Arg\left(\frac{v'}{v}\right) = +\cot^{-1}\left(\frac{Lw}{R}(LCw^2 - 1) + RCw\right)$$

Assuming $LCw^2 >> 1$, then $$Arg\left(\frac{v'}{v}\right) \approx +\cot^{-1}\left(CRw\left(\frac{L^2w^2}{R^2} + 1\right)\right)$$

By way of a worked example, consider monitoring a high voltage line at 127 KV and 50 Hz using a 4 nF capacitive column and a 10 μF base capacitance as a voltage divider and a measuring instrument with an input impedance of 2 M ohms connected across the base capacitance. A winding with an inductance of 10 H and a resistance of 1890 ohms is chosen. Conditions (1) and (2) become:

$$\epsilon = 15\% \quad LCw^2 = 9.87$$

The initial assumption that the discharge circuit could be modelled during normal operation on an LR circuit of high impedance relative to the base capacitance is therefore justified. The resulting errors in the measurement signal are about 9% in amplitude and 3° in phase. Trapped charge escapes in 86 ms instead of the 20 or seconds that would be required without the discharge circuit, where 20 seconds is the time constant of 10 μF and 2 M ohms.

Figure 2:
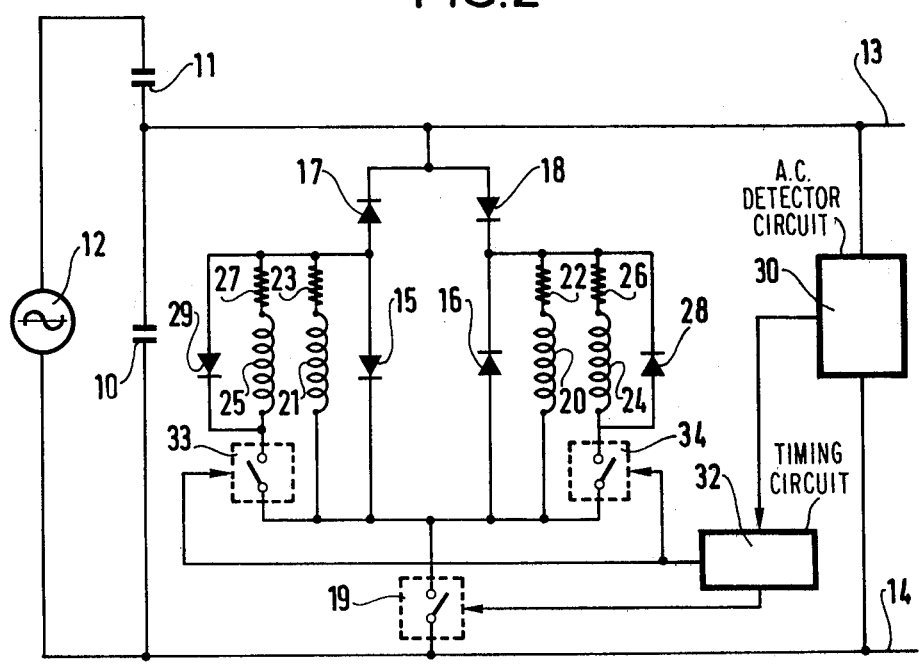
FIG. 2 is a circuit diagram of a second embodiment.

If better performance is required, i.e. shorter discharge time without increased relative phase and amplitude error in the measurement signal, auxiliary coils may be connected in parallel with all or part of the windings, each being controlled by controlled switches which open one after the other when high voltage is re-established. FIG. 2 shows a circuit that includes an auxilliary coil connected in parallel with each of the windings. Much of the circuit is the same as that of FIG. 1, and components that are unchanged from one to the other have the same reference numerals. Each auxiliary coil is shown as an inductance 24 or 25 connected in series with a respective resistance 26 or 27. The coils are connected in parallel with respective damping diodes 28 and 29 and in series with respective controlled switches 33 and 34, under the control of a timing circuit 32 which is slightly different from that of FIG. 1.

The timing circuit 32 is excited by the AC detector circuit 30. It provides three different time delays. The first simultaneously closes all three switches at a suitable period after a break is detected in the AC, say after 5 seconds. The second time delay applies only to opening the auxilliary switches 33 and 34 some tens of milliseconds after AC is re-established, while the third time delay applies to opening the switch 19 about one hundred milliseconds after AC is re-established.

The damping diodes 28 and 29 serve to loop the current passing through the auxiliary coils when the auxiliary controlled switches 33 and 34 are opened.

Placing auxiliary coils in parallel on the windings and disconnecting them progressively on high voltage AC being re-established serves to reconcile the requirement for low inductance for the charge to escape through quickly, and high inductance for minimum effect on the measurement signal. Since, whatever happens, the measurement signal is going to be badly effected while the trapped charge escapes, a high percentage error is acceptable during the escape. However, the circuit shown in FIG. 1 can not just be used with low inductance windings, since it then creates a new set of distortions to the measurement signal when the controlled switch 19 is opened, with new trapped charge causing the measurement signal to jump by a percentage error that is as great as the percentage error due to the discharge circuit itself. To avoid further jumps in the measurement signal, the inductance of the winding should be increased in steps, each of which traps less and less charge to be absorbed in the discharge circuit until the disruption to the measurement signal is small enough for the discharge circuit to be completely disconnected with a tolerable jump in the measurement signal.

Without going beyond the scope of the invention, it is possible to make various modifications to the circuit or to replace various means by equivalent means. For example, more auxiliary coils can be used with a set of controlled switches having staggered opening times, to provide a more progressive increase in the effective inductance of the discharge circuit on high voltage AC being re-established.

A capacitor may be connected between the AC terminals of the rectifier diode bridge. Its capacitance should be calculated so that it resonates with the windings 20, 22, 21 and 23 via the diode bridge at the frequency of the high voltage AC. This leads to a very high impedance being connected across the terminals of the base capacitance 10 by the controlled switch 19, and in particular, the resulting phase shift is very small.

I claim:

1. A discharge circuit for rapidly eliminating charge trapped in a capacitor voltage divider used for monitoring high voltage AC, said voltage divider comprising a capacitor column for dropping nearly all of the high voltage and a base capacitance connected in series therewith so that a small voltage appears thereacross, the improvement wherein said discharge circuit comprises a diode rectifier bridge comprising four diodes and connected by its AC terminals in parallel with the base capacitance, and two identical windings connected in parallel respectively with two of the diodes of the bridge, and both of said winding-shunted diodes being connected to the same one of the AC terminals of the diode bridge.

2. A discharge circuit for rapidly eliminating charge trapped in a capacitor voltage divider used for monitoring high voltage AC, said voltage divider comprising a capacitor column for dropping nearly all of the high voltage and a base capacitance connected in series therewith so that a small voltage appears thereacross, the improvement wherein said discharge circuit comprises a diode rectifier bridge comprising four diodes and connected by its AC terminals in parallel with the base capacitance, and two identical windings connected in parallel respectively with two of the diodes of the bridge, and both of said winding-shunted diodes being connected to the same one of the AC terminals of the diode bridge, a controlled switch connected in series between the diode bridge and the terminals of the base capacitance; an AC detector circuit connected across the terminals of the base capacitance; and a timing circuit responsive to the AC detector circuit to close the controlled switch a few seconds after the AC detector circuit detects that the AC has been interrupted, and to open the controlled switch a few tens of milliseconds after the AC detector circuit detects that AC has been established.

3. A circuit according to claim 2, further comprising auxilliary coils connected in parallel with at least a part of said windings, said auxilliary coils being connected in series with respective auxilliary controlled switches under the control of the timing circuit which is arranged to close all three switches together a few seconds after the AC has been interrupted, and which is arranged to open the auxilliary controlled switches before opening the controlled switch connected in series with the diode bridge after AC has been re-established.

4. A circuit according to claim 2, comprising a plurality of auxilliary coils connected in parallel with said windings, each of said auxilliary coils being connected in series with a respective auxilliary controlled switch controlled in such a manner that the auxilliary switches are opened at staggered intervals of time after AC has been re-established.

* * * * *